United States Patent
Kang et al.

(10) Patent No.: US 11,626,179 B2
(45) Date of Patent: Apr. 11, 2023

(54) ELECTRONIC DEVICE FOR EXECUTING TEST

(71) Applicant: SK hynix Inc., Icheon-si (KR)

(72) Inventors: Min Soo Kang, Icheon-si (KR); Noh Hyup Kwak, Icheon-si (KR); Hyun Seung Kim, Icheon-si (KR); Yong Ho Seo, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 1 day.

(21) Appl. No.: 17/395,221

(22) Filed: Aug. 5, 2021

(65) Prior Publication Data

US 2022/0375537 A1 Nov. 24, 2022

(30) Foreign Application Priority Data

May 21, 2021 (KR) .................. 10-2021-0065625

(51) Int. Cl.
| | |
|---|---|
| *G11C 29/00* | (2006.01) |
| *G11C 29/14* | (2006.01) |
| *G11C 29/36* | (2006.01) |
| *G11C 17/18* | (2006.01) |
| *G11C 17/16* | (2006.01) |

(52) U.S. Cl.
CPC .............. *G11C 29/14* (2013.01); *G11C 17/16* (2013.01); *G11C 17/18* (2013.01); *G11C 29/36* (2013.01)

(58) Field of Classification Search
CPC ......... G11C 29/14; G11C 29/36; G11C 17/16; G11C 17/18
See application file for complete search history.

(56) References Cited

U.S. PATENT DOCUMENTS

| | | | | |
|---|---|---|---|---|
| 9,875,994 | B2* | 1/2018 | Baek | ................... H01L 25/0657 |
| 10,636,510 | B2* | 4/2020 | Lee | ........................ G11C 29/38 |
| 2009/0141577 | A1* | 6/2009 | Chu | .................... G11C 29/4401 |
| | | | | 365/201 |
| 2015/0084668 | A1* | 3/2015 | Yun | .................. G11C 29/50008 |
| | | | | 324/762.05 |

FOREIGN PATENT DOCUMENTS

KR 1020100073376 A 7/2010

\* cited by examiner

*Primary Examiner* — Christine T. Tu
(74) *Attorney, Agent, or Firm* — William Park & Associates Ltd.

(57) ABSTRACT

An electronic device includes a masking signal generation circuit configured to generate a test masking signal by receiving a fuse data during a period in which a test masking mode is executed; and a test mode signal generation circuit configured to, when a test command for executing a test in an internal circuit is input, execute the test based on the test masking signal.

10 Claims, 5 Drawing Sheets

ELECTRONIC DEVICE FOR EXECUTING TEST

CROSS-REFERENCE TO RELATED APPLICATION

The present application claims priority under 35 U.S.C. § 119(a) to Korean application number 10-2021-0065625, filed in the Korean Intellectual Property Office on May 21, 2021, the entire disclosure of which is incorporated herein by reference in its entirety.

BACKGROUND

1. Technical Field

The present disclosure relates to an electronic device for executing a test.

2. Related Art

Before shipping a semiconductor device, a test to verify whether the semiconductor device has a failure should be executed. In this regard, in order to reduce a time required for the test, a scheme of simultaneously testing a plurality of semiconductor devices may be used.

SUMMARY

In an example, an electronic device may include: a masking signal generation circuit configured to generate a test masking signal by receiving a fuse data during a period in which a test masking mode is executed; and a test mode signal generation circuit configured to, when a test command for executing a test in an internal circuit is input, execute the test, based on the test masking signal.

In an example, an electronic device may include: a test code generation circuit configured to generate a test code for setting a test mode when a test command for executing a test in an internal circuit is input; and a test control circuit configured to control an execution of the test, for each test mode, based on a fuse data, when the test command is input during a period in which a test masking mode is executed.

DETAILED DESCRIPTION

In the following descriptions of examples, the term "preset" indicates that the numerical value of a parameter is previously decided, when the parameter is used in a process or algorithm. According to an example, the numerical value of the parameter may be set when the process or algorithm is started or while the process or algorithm is performed.

Terms such as "first" and "second," which are used to distinguish among various components, are not limited by the components. For example, a first component may be referred to as a second component, and vice versa.

When one component is referred to as being "coupled" or "connected" to another component, it should be understood that the components may be directly coupled or connected to each other or coupled or connected to each other through another component interposed therebetween. On the other hand, when one component is referred to as being "directly coupled" or "directly connected" to another component, it should be understood that the components are directly coupled or connected to each other without another component interposed therebetween.

"Logic high level" and "logic low level" are used to describe the logic levels of signals. A signal with "logic high level" is distinguished from a signal with "logic low level." For example, when a signal with a first voltage corresponds to a signal with a "logic high level," a signal with a second voltage may correspond to a signal with a "logic low level," According to an example, a "logic high level" may be set to a voltage higher than a "logic low level." According to an example, the logic levels of signals may be set to different logic levels or opposite logic levels. For example, a signal with a logic high level may be set to have a logic low level according to an example, and a signal with a logic low level may be set to have a logic high level according to an example.

Hereafter, the teachings of the present disclosure will be described in more detail through examples. These examples are only used to exemplify the teachings of the present disclosure, and the scope of the present disclosure is not limited by these examples.

Some examples of the present disclosure are directed to an electronic device for executing a test.

According to the present disclosure, when a test command for executing a test is input during a period in which a test masking mode is executed, whether to execute a test may be controlled based on fuse data. Thus, when simultaneously testing a plurality of devices, whether to execute a test may be differently controlled for the respective devices, thereby improving the flexibility of each test and reducing a time required for each test.

Figure 1:
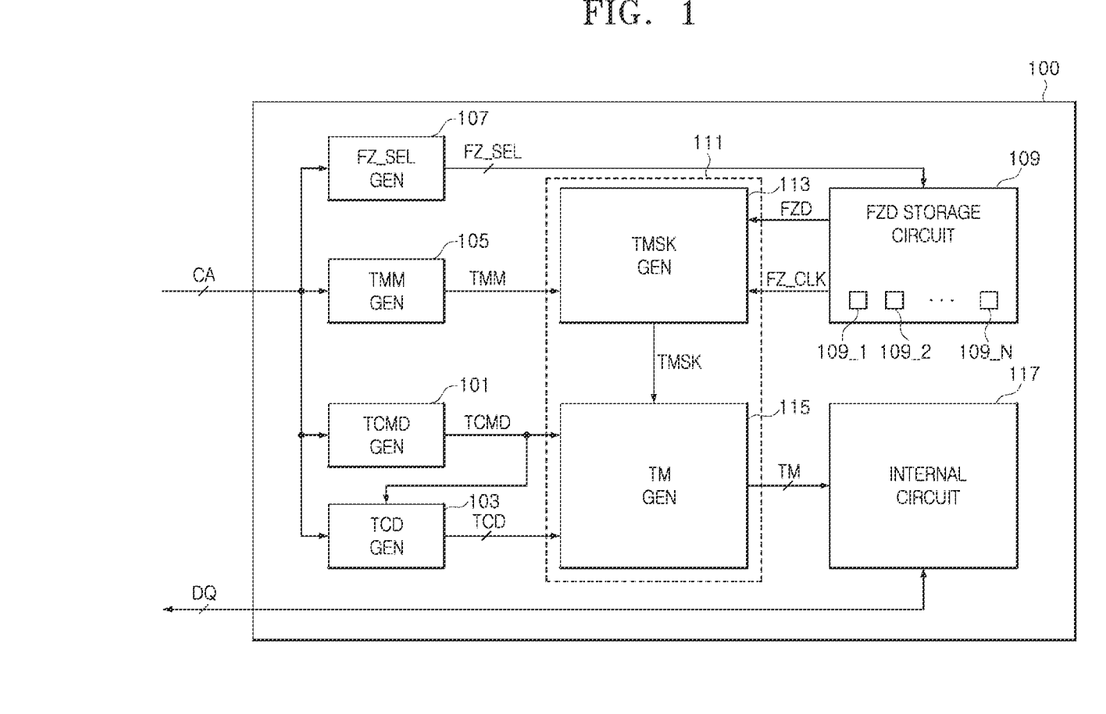
FIG. 1 is a block diagram illustrating a configuration of an electronic device in accordance with an example of the present disclosure.

FIG. 1 is a block diagram illustrating a configuration of an electronic device 100 in accordance with an example of the present disclosure. As illustrated in FIG. 1, the electronic device 100 may include a test command generation circuit (TCMD GEN) 101, a test code generation circuit (TCD GEN) 103, a masking mode signal generation circuit (TMM GEN) 105, a region select signal generation circuit (FZ_SEL GEN) 107, a fuse data storage circuit (FZD STORAGE CIRCUIT) 109, a test control circuit 111, and an internal circuit (INTERNAL CIRCUIT) 117.

The electronic device 100 may be implemented with a memory device that stores and outputs data DQ based on a setting code CA. The electronic device 100 may perform various internal operations, such as a write operation and a read operation, based on the setting code CA. The setting code CA may include information on a command and an address. Each of the setting code CA and the data DQ may be applied from an external device, outside of the electronic device 100. As an example, each of the setting code CA and the data DQ may be applied from a test device (1100 of FIG. 5). As another example, each of the setting code CA and the data DQ may be applied from a memory controller (not illustrated). The number of bits of each of the setting code CA and the data DQ may be variously set based on the embodiment.

The test command generation circuit 101 may generate a test command TCMD based on the setting code CA. The test command generation circuit 101 may activate the test command TCMD by decoding the setting code CA with a combination for executing a test. The test command TCMD may be activated to execute a test in the internal circuit 117.

The test code generation circuit 103 may generate a test code TCD from the setting code CA based on the test command TCMD. When the test command TCMD is activated, the test code generation circuit 103 may extract the setting code CA with a combination for setting a test mode and output the extracted setting code CA as the test code TCD. The number of bits of the test code TCD may be variously set based on the embodiment. The test code TCD may have a combination for setting a test mode that is executed in the internal circuit 117. For example, a first combination of the test code TCD may be set as a combination for executing a first test mode in the internal circuit 117, and a second combination of the test code TCD may be set as a combination for executing a second test mode in the internal circuit 117. Each test mode may independently set a type of stress that is applied to the internal circuit 117. For example, the first test mode may be set as a test that applies a stress by adjusting the level of an internal voltage that is applied to the internal circuit 117, and the second test mode may be set as a test that applies a stress by adjusting the pulse width of a signal that is applied to the internal circuit 117. Also, each test mode may differently set a degree of stress. For example, the first test mode may be set as a test that applies a stress by setting the level of an internal voltage, applied to the internal circuit 117, to be larger than that in the second test mode. In another example, the first test mode may be set as a test that applies a stress by decreasing the puke width of a signal, applied to the internal circuit 117, more than that in the second test mode.

The masking mode signal generation circuit 105 may generate a test masking mode signal TMM based on the setting code CA. The masking mode signal generation circuit 105 may activate the test masking mode signal TMM by decoding the setting code CA with a combination for executing a test masking mode. The masking mode signal generation circuit 105 may deactivate the test masking mode signal TMM by decoding the setting code CA with a combination for ending the test masking mode. The test masking mode signal TMM may be activated during a period in which the test masking mode is executed.

The region select signal generation circuit 107 may generate a fuse region select signal FZ_SEL based on the setting code CA. The region select signal generation circuit 107 may generate the fuse region select signal FZ_SEL based on the setting code CA for controlling the operation of the fuse data storage circuit 109. The fuse region select signal FZ_SEL may have a combination corresponding to each of fuse regions 109_1 to 109_N. For example, the fuse region select signal FZ_SEL may have a first combination that corresponds to a first fuse region 109_1 and a second combination that corresponds to a second fuse region 109_2. The fuse region select signal FZ_SEL may be generated when the test command TCMD for executing a test in the internal circuit 117 is generated.

The fuse data storage circuit 109 may include the plurality of fuse regions 109_1 to 109_N, each of which stores fuse data FZD. The number of bits of the fuse data FZD may be variously set based on the embodiment. The fuse data storage circuit 109 may store information on whether to execute a test, as the fuse data FZD in each of the plurality of fuse regions 109_1 to 109_N, for each test mode, based on a result of a wafer test. For example, the fuse data storage circuit 109 may store information on whether to execute the first test mode, as the fuse data FZD in the first fuse region 109_1, based on a result of a wafer test. The fuse data storage circuit 109 may store information on whether to execute the second test mode, as the fuse data FZD in the second fuse region 109_2, based on a result of a wafer test. The wafer test means a test that is executed when the electronic device 100 is in a wafer state. The fuse data storage circuit 109 may set a pattern of the fuse data FZD based on a result of a wafer test. Each of the plurality of fuse regions 109_1 to 109_N may be implemented with an electrically programmable e-fuse. The fuse data storage circuit 109 may be implemented with an ARE (array rupture e-fuse) circuit in which the plurality of fuse regions 109_1 to 109_N are arranged in an array form.

The fuse data storage circuit 109 may output the fuse data FZD and a fuse clock FZ_CLK based on the fuse region select signal FZ_SEL. Each combination of the fuse region select signal FZ_SEL may correspond to each of the plurality of fuse regions 109_1 to 109_N. When the test command TCMD is generated, the fuse data storage circuit 109 may output the fuse data FZD that is stored in one of the plurality of fuse regions 109_1 to 109_N, based on the fuse region select signal FZ_SEL. For example, the fuse data storage circuit 109 may output the fuse data FZD, stored in the first fuse region 109_1, together with the fuse clock FZ_CLK, based on the first combination of the fuse region select signal FZ_SEL. The fuse data storage circuit 109 may output the fuse data FZD, stored in the second fuse region 109_2, together with the fuse clock FZ_CLK, based on the second combination of the fuse region select signal FZ_SEL.

The test control circuit 111 may include a masking signal generation circuit (TMSK GEN) 113 and a test mode signal generation circuit (TM GEN) 115. The test control circuit 111 may generate a test mode signal TM based on the test masking mode signal TMM, the fuse data FZD, the fuse clock FZ_CLK, the test command TCMD, and the test code TCD.

When the test masking mode signal TMM for executing the test masking mode is deactivated, the test control circuit 111 may generate the test mode signal TM, depending on a combination of the test code TCD, based on the test command TCMD. The test mode signal TM may be activated to execute a test in a test mode that corresponds to a combination of the test code TCD. For example, a first test mode signal TM1 may be activated to execute a test in the first test mode, and a second test mode signal TM2 may be activated to execute a test in the second test mode.

When the test command TCMD is input during a period in which the test masking mode is executed, the test control circuit 111 may receive the fuse data FZD in synchronization with the fuse dock FZ_CLK. When the test command TCMD is input during a period in which the test masking mode is executed, the test control circuit 111 may control whether to execute a test based on the fuse data FZD. When the test command TCMD is input during a period in which the test masking mode is executed, the test control circuit 111 may control whether to execute a test by detecting whether the pattern of the fuse data FZD is a preset pattern. In more detail, when the pattern of the fuse data FZD is the preset pattern during a period in which the test masking mode is executed, the test control circuit 111 may deactivate the test mode signal TM. Conversely, when the pattern of the fuse data FZD is different from the preset pattern during a period in which the test masking mode is executed, the test control circuit 111 may generate the test mode signal TM based on the combination of the test code TCD. When the test command TCMD is input during a period in which the test masking mode is executed, the test control circuit 111 may control whether to execute a test, for each test mode, based on the fuse data FZD. For example, when the test command TCMD is input during a period in which the test masking mode is executed, the test control circuit 111 may control whether to execute the first test mode based on the fuse data FZD that is stored in the first fuse region 109_1. When the test command TCMD is input during a period in which the test masking mode is executed, the test control circuit 111 may control whether to execute the second test mode based on the fuse data FZD that is stored in the second fuse region 109_2.

The masking signal generation circuit 113 may generate a test masking signal TMSK by receiving the fuse data FZD and the fuse clock FZ_CLK based on the test masking mode signal TMM. The test masking signal TMSK may be generated to control whether to execute a test. During a period in which the test masking mode is executed, the masking signal generation circuit 113 may receive the fuse data FZD in synchronization with the fuse clock FZ_CLK. The masking signal generation circuit 113 may generate the test masking signal TMSK by detecting whether the pattern of the fuse data FZD is the preset pattern during a period in which the test masking mode is executed. The masking signal generation circuit 113 may activate the test masking signal TMSK when the pattern of the fuse data FZD is the preset pattern during a period in which the test masking mode is executed. For example, the masking signal generation circuit 113 may activate the test masking signal TMSK when the fuse data FZD is input at a logic high level. For another example, the masking signal generation circuit 113 may activate the test masking signal TMSK when at least one bit among bits of the fuse data FZD is input at a logic high level. The masking signal generation circuit 113 may deactivate the test masking signal TMSK when the pattern of the fuse data FZD is different from the preset pattern during a period in which the test masking mode is executed. The masking signal generation circuit 113 may deactivate the test masking signal TMSK when the test masking mode signal TMM is deactivated.

When the test command TCMD for executing a test is input, the test mode signal generation circuit 115 may generate the test mode signal TM based on the test code TCD and the test masking signal TMSK. When the test command TCMD for executing a test is input, the test mode signal generation circuit 115 may execute the test based on the test masking signal TMSK. In more detail, when the test command TCMD is input during a period in which the test masking signal TMSK is activated, the test mode signal generation circuit 115 may deactivate the test mode signal TM. Conversely, when the test command TCMD is input during a period in which the test masking signal TMSK is deactivated, the test mode signal generation circuit 115 may generate the test mode signal TM depending on a combination of the test code TCD. For example, when the test command TCMD is input during a period in which the test masking signal TMSK is deactivated, the test mode signal generation circuit 115 may activate the first test mode signal TM1 based on the first combination of the test code TCD. When the test command TCMD is input during a period in which the test masking signal TMSK is deactivated, the test mode signal generation circuit 115 may activate the second test mode signal TM2 based on the second combination of the test code TCD.

The internal circuit 117 may include a plurality of memory cells (not illustrated) that store and output the data DQ. In more detail, the internal circuit 117 may receive the data DQ and store the received data DQ in the plurality of memory cells when performing a write operation and may output the data DQ, stored in the plurality of memory cells, when performing a read operation. The internal circuit 117 may execute a test in a test mode that corresponds to the test mode signal TM. For example, the internal circuit 117 may execute a test in the first test mode when the first test mode signal TM1 is activated and may execute a test in the second test mode when the second test mode signal TM2 is activated.

Figure 2:
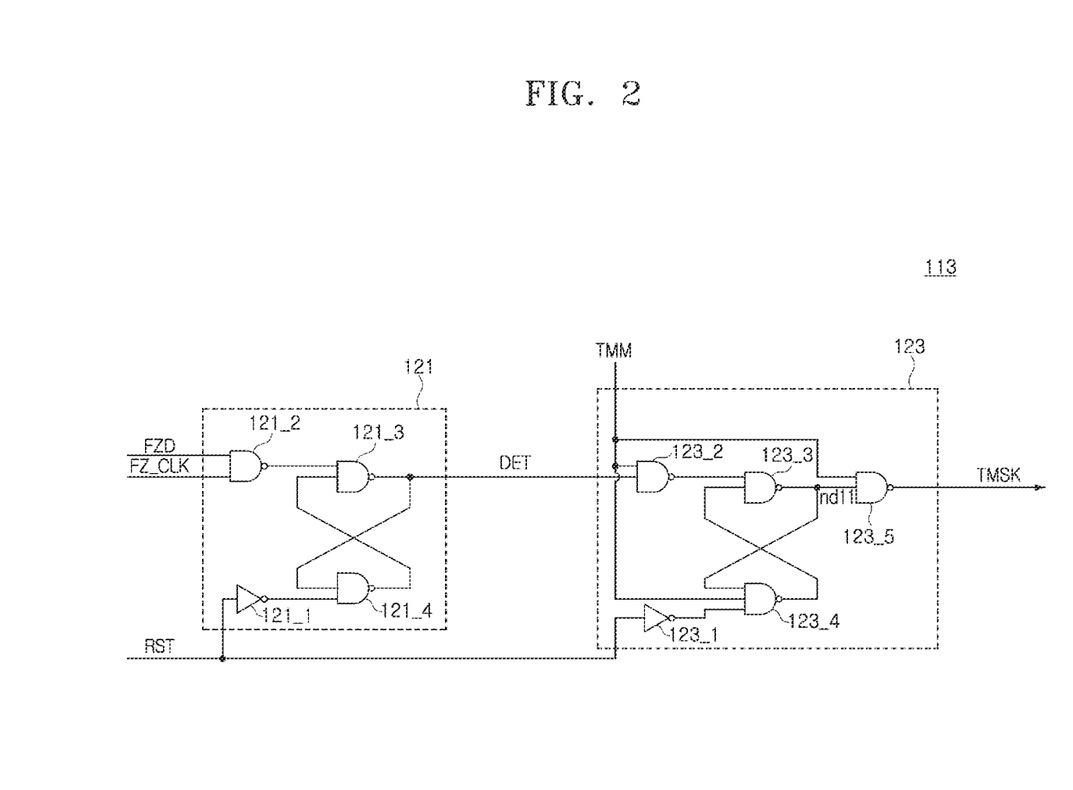
FIG. 2 is a circuit diagram illustrating an example of a masking signal generation circuit illustrated in FIG. 1.

FIG. 2 is a circuit diagram illustrating an example of the masking signal generation circuit 113 illustrated in FIG. 1. As illustrated in FIG. 2, the masking signal generation circuit 113 may include a detection signal generation circuit 121 and a masking signal output circuit 123.

The detection signal generation circuit 121 may generate a detection signal DET based on the fuse data FZD, the fuse clock FZ_CLK, and a reset signal RST. The detection signal generation circuit 121 may receive the fuse data FZD in synchronization with the fuse clock FZ_CLK. In the present embodiment, the detection signal generation circuit 121 may receive the fuse data FZD, one bit by one bit, in synchronization with the fuse clock FZ_CLK. The detection signal generation circuit 121 may activate the detection signal DET when the pattern of the fuse data FZD is the preset pattern. In the present embodiment, the preset pattern may be set as a pattern in which at least one bit among the bits of the fuse data FZD is set to a logic high level. The detection signal generation circuit 121 may deactivate the detection signal DET by performing an initialization operation based on the reset signal RST. The reset signal RST may be activated to perform the initialization operation after a preset period from a point of time in which the detection signal generation circuit 121 receives the fuse data FZD. The preset period may be variously set depending on an embodiment. The reset signal RST may be generated from the setting code CA (see FIG. 1) for the initialization operation. The detection signal generation circuit 121 may include an inverter 121_1 and NAND gates 121_2, 121_3, and 121_4. The detection signal generation circuit 121 may activate the detection signal DET to a logic high level when an output signal of the NAND gate 121_2 has a logic low level. The detection signal generation circuit 121 may deactivate the detection signal DET to a logic low level when an output signal of the inverter 121_1 has a logic low level.

The masking signal output circuit 123 may generate the test masking signal TMSK based on the test masking mode signal TMM, the detection signal DET, and the reset signal RST. The masking signal output circuit 123 may activate the test masking signal TMSK when the detection signal DET is activated during a period in which the test masking mode is executed. The masking signal output circuit 123 may deactivate the test masking signal TMSK when the detection signal DET is deactivated during a period in which the test masking mode is executed. The masking signal output circuit 123 may deactivate the test masking signal TMSK when the test masking mode signal TMM is deactivated. When the reset signal RST is activated, the masking signal output circuit 123 may deactivate the test masking signal TMSK by performing the initialization operation. The masking signal output circuit 123 may include an inverter 123_1 and NAND gates 123_2, 123_3, 123_4, and 123_5. The masking signal output circuit 123 may activate an internal node nd11 to a logic high level when an output signal of the NAND gate 123_2 has a logic low level. The masking signal output circuit 123 may deactivate the internal node nd11 to a logic low level when an output signal of the inverter 123_1 has a logic low level. The NAND gate 123_5 may output the test masking signal TMSK by inverting and buffering the signal of the internal node nd11 during a period in which the test masking mode signal TMM is activated to a logic high level. The NAND gate 123_5 may deactivate the test masking signal TMSK to a logic high level during a period in which the test masking mode signal TMM is deactivated to a logic low level.

Figure 3:
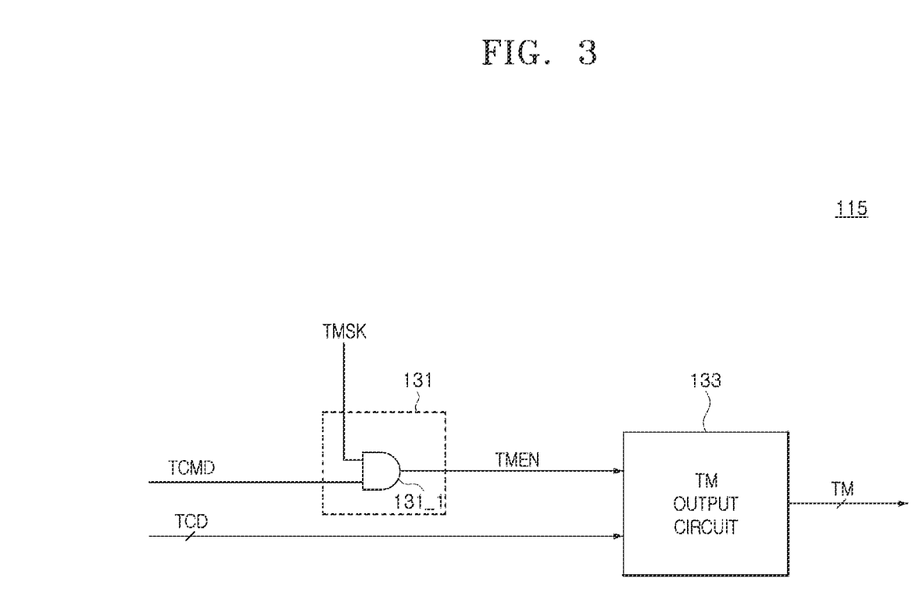
FIG. 3 is a diagram illustrating an example of a test mode signal generation circuit illustrated in FIG. 1.

FIG. 3 is a diagram illustrating an example of the test mode signal generation circuit 115 illustrated in FIG. 1. As illustrated in FIG. 3, the test mode signal generation circuit 115 may include a test enable signal generation circuit 131 and a test mode signal output circuit (TM OUTPUT CIRCUIT) 133.

The test enable signal generation circuit 131 may generate a test enable signal TMEN based on the test masking signal TMSK when the test command TCMD is input. The test enable signal generation circuit 131 may deactivate the test enable signal TMEN during a period in which the test masking signal TMSK is activated. The test enable signal generation circuit 131 may activate the test enable signal TMEN when the test command TCMD is input during a period in which the test masking signal TMSK is deactivated. The test enable signal generation circuit 131 may include an AND gate 131_1. The AND gate 131_1 may deactivate the test enable signal TMEN to a logic low level during a period in which the test masking signal TMSK is activated to a logic low level. The AND gate 131_1 may output the test enable signal TMEN by buffering the test command TCMD during a period in which the test masking signal TMSK is deactivated to a logic high level.

The test mode signal output circuit 133 may generate the test mode signal TM, depending on a combination of the test code TCD, based on the test enable signal TMEN. The test mode signal output circuit 133 may generate the test mode signal TM based on the combination of the test code TCD during a period in which the test enable signal TMEN is activated. For example, the test mode signal output circuit 133 may activate the first test mode signal TM1 for executing the first test mode, based on the first combination of the test code TCD, during a period in which the test enable signal TMEN is activated. The test mode signal output circuit 133 may activate the second test mode signal TM2 for executing the second test mode, based on the second combination of the test code TCD, during a period in which the test enable signal TMEN is activated. The test mode signal output circuit 133 may deactivate the test mode signal TM when the test enable signal TMEN is deactivated.

Figure 4:
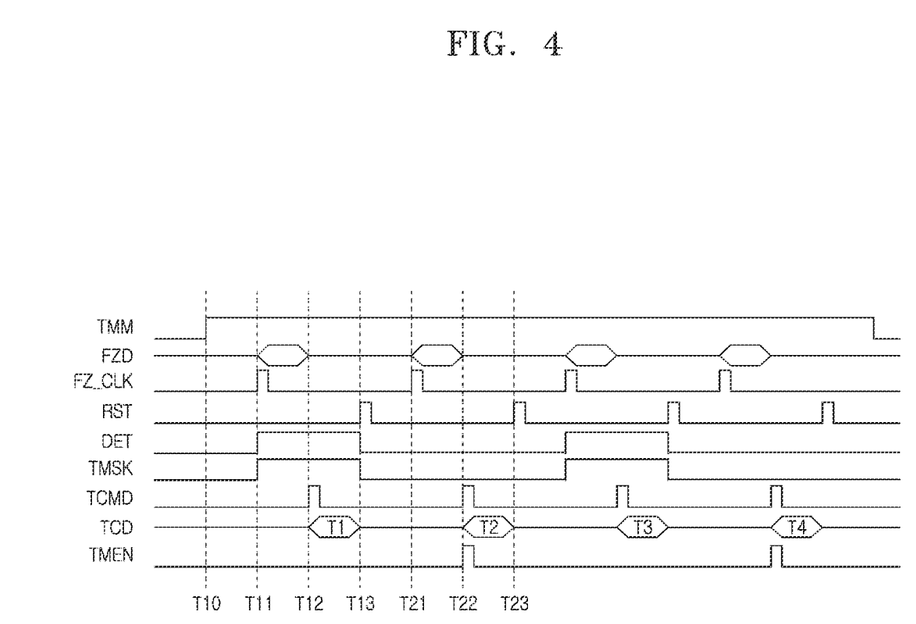
FIG. 4 is a timing diagram to assist in the explanation of the operation of the electronic device illustrated in FIG. 1.

FIG. 4 is a timing diagram to assist in the explanation of an operation of controlling whether to execute a test in the electronic device 100 illustrated in FIG. 1.

At a time point T10, the masking mode signal generation circuit 105 may activate the test masking mode signal TMM for executing the test masking mode.

At a time point T11, the fuse data storage circuit 109 may output the fuse data FZD, stored in the first fuse region 109_1, together with the fuse dock FZ_CLK, based on the fuse region select signal FZ_SEL. The detection signal generation circuit 121 (see FIG. 2) may activate the detection signal DET when the pattern of the fuse data FZD is the preset pattern. The masking signal output circuit 123 (see FIG. 2) may activate the test masking signal TMSK when the detection signal DET is activated to a logic high level during a period in which the test masking mode signal TMM is activated.

At a time point T12, the test command generation circuit 101 may generate the test command TCMD. The test code generation circuit 103 may generate the test code TCD for executing a first test mode T1. The test mode signal generation circuit 115 may deactivate the test enable signal TMEN (see FIG. 3) based on the activated test masking signal TMSK.

At a time point T13, the detection signal generation circuit 121 (see FIG. 2) may deactivate the detection signal DET based on the activated reset signal RST (see FIG. 2). The masking signal output circuit 123 (see FIG. 2) may deactivate the test masking signal TMSK based on the activated reset signal RST.

At a time point T21, the fuse data storage circuit 109 may output the fuse data FZD, stored in the second fuse region 109_2, together with the fuse clock FZ_CLK, based on the fuse region select signal FZ_SEL. The detection signal generation circuit 121 (see FIG. 2) may deactivate the detection signal DET when the pattern of the fuse data FZD is different from the preset pattern. The masking signal output circuit 123 (see FIG. 2) may deactivate the test masking signal TMSK when the detection signal DET is deactivated during a period in which the test masking mode signal TMM is activated.

At a time point T22, the test command generation circuit 101 may generate the test command TCMD. The test code generation circuit 103 may generate the test code TCD for executing a second test mode T2. The test mode signal generation circuit 115 may activate the test enable signal TMEN (see FIG. 3) based on the deactivated test masking signal TMSK and the activated test command TCMD.

At a time point T23, the detection signal generation circuit 121 (see FIG. 2) may deactivate the detection signal DET based on the activated reset signal RST (see FIG. 2). The masking signal output circuit 123 (see FIG. 2) may deactivate the test masking signal TMSK based on the activated reset signal RST.

Figure 5:
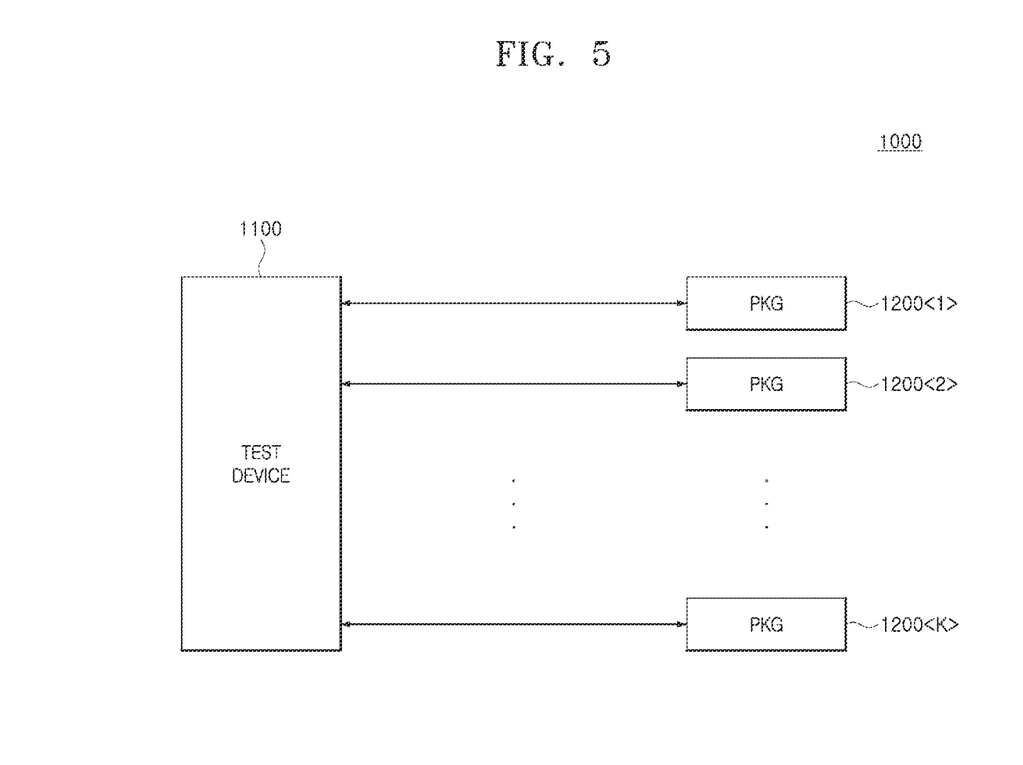
FIG. 5 is a block diagram illustrating a configuration of an example of a system to which the electronic device illustrated in FIG. 1 is applied.

FIG. 5 is a block diagram illustrating a configuration of an example of a system 1000 to which the electronic device 100, illustrated in FIG. 1, is applied. As illustrated in FIG. 5, the system 1000 may include the test device (TEST DEVICE) 1100 and a plurality of packages (PKG) 1200<1:K>. Each of the plurality of packages 1200<1:K> may be implemented with the electronic device 100, which is in a package state. 'K' may be set to a natural number equal to or greater than 2. Each of the plurality of packages 1200<1:K> may be in a state in which the fuse data FZD is stored in the fuse data storage circuit 109 based on a result of a wafer test.

The test device 1100 may output the setting code CA (see FIG. 1) to the plurality of packages 1200<1:K>. The plurality of packages 1200<1:K> may share a signal line through which the setting code CA is transmitted from the test device 1100. The test device 1100 may transmit and receive the data DQ (see FIG. 1) to and from the plurality of packages 1200<1:K>. The plurality of packages 1200<1:K> may share a signal line through which the data DQ is transmitted from the test device 1100.

The test device 1100 may output the setting code CA (see FIG. 1) for executing a test in the plurality of packages 1200<1:K>. For example, the test device 1100 may output the setting code CA, for executing the first test mode, to the plurality of packages 1200<1:K>. The test device 1100 may output the setting code CA, for executing the second test mode, to the plurality of packages 1200<1:K>.

Each of the plurality of packages 1200<1:K> may control whether to execute a test, for each test mode, based on the fuse data FZD (see FIG. 1) that is stored in the fuse data storage circuit 109 (see FIG. 1). For example, a first package 1200<1> may execute the first test mode, and a second package 1200<2> might not execute the first test mode. Conversely, the first package 1200<1> might not execute the second test mode, and the second package 1200<2> may execute the second test mode.

As is apparent from the above description, according to the present disclosure, when a test command for executing a test is input during a period in which a test masking mode is executed, whether to execute a test may be controlled based on fuse data. Thus, when simultaneously testing a plurality of devices, whether to execute a test may be differently controlled for the respective devices, thereby improving the flexibility of each test and reducing a time required for each test.

Although some examples of the present teachings have been disclosed for illustrative purposes, those skilled in the art will appreciate that various modifications, additions and substitutions are possible, without departing from the scope and spirit of the present teachings as defined in the accompanying claims.

What is claimed is:

1. An electronic device comprising:
    test command generation circuit configured to generate a test command based on a setting code;
    a detection signal generation circuit configured to receive a fuse data and activate a detection signal when a pattern of the fuse data is a preset pattern;
    a masking signal output circuit configured to activate a test masking signal when the detection signal is activated during a period in which a test masking mode is executed; and
    a test mode signal generation circuit configured to execute a test based on the test masking signal when the test command is activated.

2. The electronic device according to claim 1, further comprising:
    a fuse data storage circuit configured to store information on whether to execute the test, as the fuse data, based on a result of a wafer test.

3. The electronic device according to claim 2, wherein the fuse data storage circuit comprises a plurality of fuse regions, the fuse data storage circuit outputting the fuse data that is stored in a fuse region that corresponds to a fuse region select signal.

4. The electronic device according to claim 1, wherein the detection signal generation circuit deactivates the detection signal by performing an initialization operation after a preset period from a point of time in which the fuse data is received.

5. The electronic device according to claim 1, wherein the masking signal output circuit deactivates the test masking signal when a test masking mode signal for executing the test masking mode is deactivated.

6. The electronic device according to claim 1, wherein the test mode signal generation circuit generates a test mode signal for executing the test in an internal circuit when the test command is input, and deactivates the test mode signal when the test masking signal is activated.

7. The electronic device according to claim 1, wherein the test mode signal generation circuit comprises:
    a test enable signal generation circuit configured to generate a test enable signal based on the test masking signal when the test command is input; and
    a test mode signal output circuit configured to generate the test mode signal, depending on a combination of a test code, based on the test enable signal.

8. The electronic device according to claim 7, further comprising:
    a test code generation circuit configured to generate the test code for setting a test mode when the test command is input.

9. The electronic device according to claim 8, further comprising:
    a fuse data storage circuit configured to store the fuse data, the fuse data storage circuit with a plurality of fuse regions, each of which stores information on whether to execute the test, for each test mode, as the fuse data.

10. The electronic device according to claim 1, wherein an internal circuit comprises a plurality of memory cells that receive and store data when performing a write operation and output the stored data when performing a read operation.

\* \* \* \* \*